(12) United States Patent
Davis (10) Patent No.: US 6,768,351 B1
(45) Date of Patent: Jul. 27, 2004

(54) APPARATUS AND A METHOD FOR PMOS DRAIN CURRENT DEGRADATION COMPENSATION

(75) Inventor: Jeffrey B. Davis, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/400,978

(22) Filed: Mar. 26, 2003

(51) Int. Cl.[7] .............................................. H03B 1/00
(52) U.S. Cl. ........................ 327/108; 327/404; 327/546
(58) Field of Search ........................... 326/87; 327/108, 327/109, 111, 112, 403, 404, 545, 546

(56) References Cited

U.S. PATENT DOCUMENTS 6,218,863 B1 * 4/2001 Hsu et al. ..................... 326/87
6,587,994 B1 * 7/2003 Yamaji ........................... 716/4
6,661,250 B2 * 12/2003 Kim et al. ..................... 326/30

* cited by examiner

Primary Examiner—Jeffrey Zweizig
(74) Attorney, Agent, or Firm—Blakely, Sokoloff, Taylor & Zafman LLP (57) ABSTRACT

An apparatus and a method for compensating the drain current degradation in pMOS transistors are disclosed. The pMOS transistor receiving drain current compensation is a primary pMOS transistor. The apparatus comprises of a plurality of pMOS transistors subject to drain current degradation correlating to drain current degradation of the primary pMOS transistor, at least one compensation pMOS transistor coupled in parallel with the primary pMOS transistor, and an output voltage decoder to activate one or more of the compensation pMOS transistors to compensate for the drain current degradation of the primary pMOS transistor based on monitored drain current degradation of the plurality of pMOS transistors.

21 Claims, 10 Drawing Sheets

Cross-section of a pMOS transistor

Figure 1

Vt Shift of pMOS

Figure 2

Figure 2A - pMOS I-V characteristic

Multiplexer
Figure 4

Figure 5

Output Voltage Decoder

Over-Voltage Detector

APPARATUS AND A METHOD FOR PMOS DRAIN CURRENT DEGRADATION COMPENSATION

FIELD OF INVENTION

The present invention relates to semiconductor technology, and more particularly, to compensation of drain current degradation of P-type Metal Oxide Semi-conductor ("pMOS") transistors.

BACKGROUND

Figure 1:
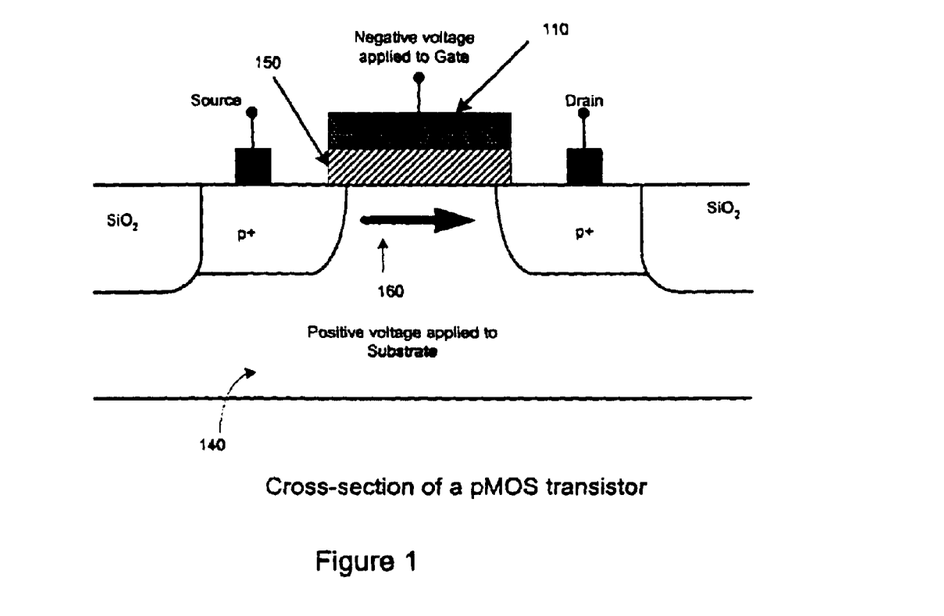
FIG. 1 is a cross-section of a pMOS transistor.

Drain current degradation in pMOS transistors may be caused by temperature and electric field induced gate oxide changes. An example of such changes is pMOS bias temperature degradation ("PBT"). Drain current degradation occurs over the operating life of a pMOS transistor. PMOS transistors are stressed by vertical electric fields, unlike n-type transistors ("nMOS"), pMOS degradation occurs during such stress regardless of whether drain current flows or not. FIG. 1 shows a cross-section of a pMOS transistor. The substrate 140 of the pMOS transistor is biased with a positive voltage. When a negative voltage is applied to the gate 110 of the transistor, a vertical electric field is created across the gate oxide. The vertical electric field stresses the gate oxide 150 and causes an increase in Vtp which in turn causes the drain current 160 flowing throw the pMOS transistor to degrade over time. Such drain current degradation is commonly known as the aging of a pMOS transistor.

Figure 2:
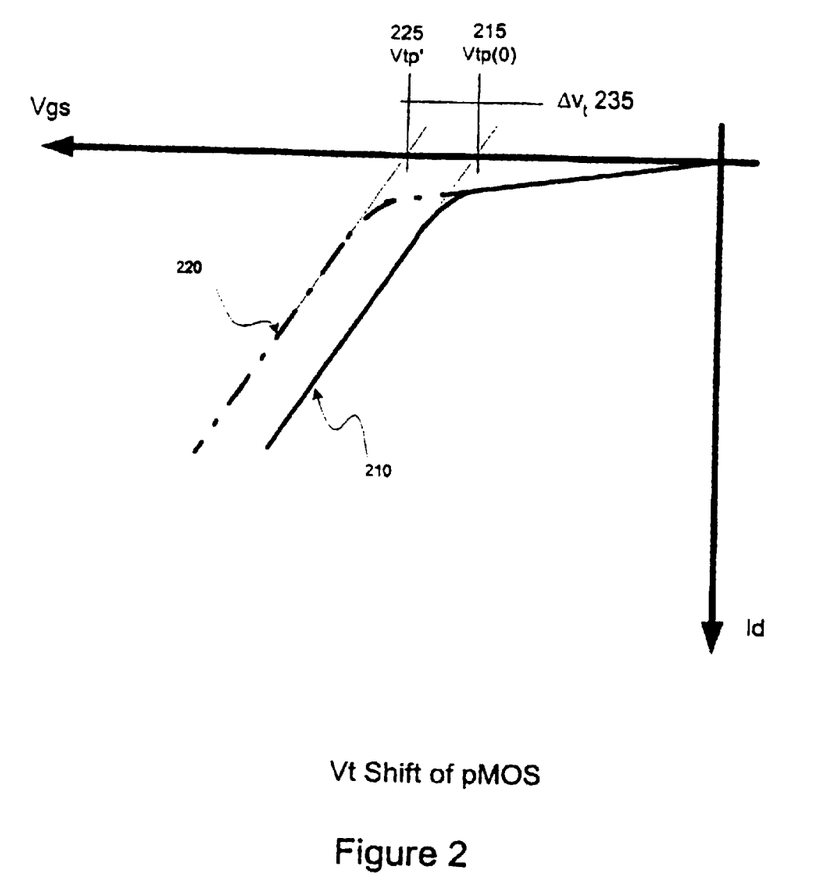
FIG. 2 shows the initial Vt of a pMOS transistor and the Vt of the pMOS transistor over time.
Figure 2A:
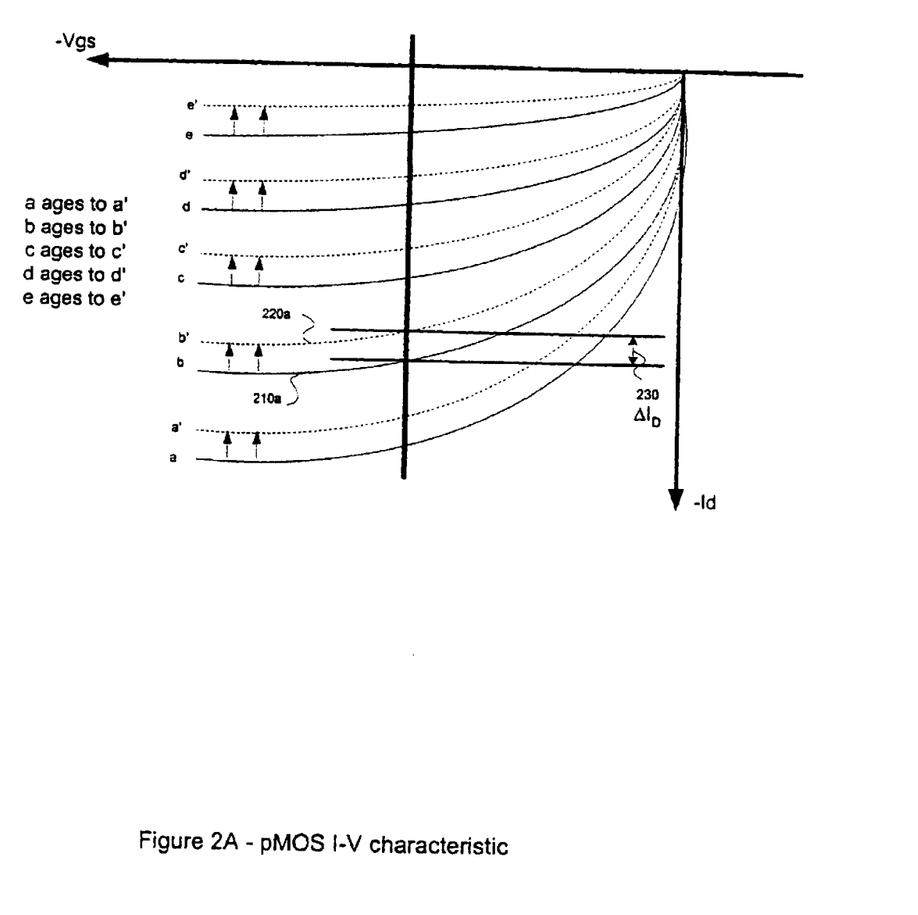
FIG. 2A shows the initial current-voltage (I–V) curve of a pMOS transistor and an I–V curve of the pMOS transistor over time.

The effect of drain current degradation of a pMOS transistor over time is shown in FIG. 2. In FIG. 2, a graph of the drain current of a pMOS transistor against the voltage across the gate and source of the pMOS transistor (I–V curve) is shown. Curve 210 is the initial I–V curve of a pMOS transistor. The initial threshold voltage of the pMOS is Vtp 215. Over time, due to stress on the gate oxide of the pMOS transistor, the threshold voltage of the pMOS transistor shifts to Vtp'225, which is more negative than the initial threshold voltage Vtp 215. Therefore, after aging, a more negative voltage across the gate and source of the pMOS is required to invert the channel of the aged pMOS transistor. In other words, the I–V curve of the pMOS transistor is shifted left over time and by temperature as indicated by the curve 220 in FIG. 2A. The drain current degradation is the drop in drain current, $\Delta I_d$ 230 in FIG. 2A.

The pMOS transistors driving an input/output may be particularly susceptible to drain current degradation since their drain terminals may be connected to a cable internal or external to a computer system, stress could be unintentionally applied to the pMOS drain as a result of a mechanical failure due to an object rolling over the cable or someone repeatedly stepping onto the cable creating a short circuit. High voltages at the input/output may go to the drain of the pMOS transistor driving the input/output. Coupled with the negative voltage applied onto the gate of the pMOS transistor, the high voltage creates a strong electric field stressing the gate oxide of the pMOS transistor. Over time, and especially at elevated temperature, the stress on the gate oxide of the pMOS transistor causes drain current degradation in the pMOS transistor.

To alleviate the problem of pMOS drain current degradation, circuits using external components not subject to aging, such as precision resistors, may be used to calibrate schemes intended to compensate for drain current variations of the pMOS transistors in an input/output device. Ordinarily, the external components are mounted on a printed circuit board. An interface using these methods must include extra signal paths and firmware specific to the method for calibration and operation. Adding these external components to an interface device is very expensive and alters the form and function of the interface. In addition, a clock signal from the system in which the interface is used must be provided to facilitate the external components to calibrate and compensate for drain current degradation.

BRIEF DESCRIPTION OF THE DRAWINGS

Embodiments of the present invention will be understood more fully from the detailed description that follows and from the accompanying drawings, which however, should not be taken to limit the invention to the specific embodiments shown, but are for explanation and understanding only.

DETAILED DESCRIPTION

A circuit to compensate for drain current degradation of a pMOS transistor is described. In the following description, numerous details are set forth, such as specific circuit configurations, device sizes and number, etc., in order to provide a thorough understanding of embodiments of the invention. It will be clear, however, to one of ordinary skill in the art, that these specific details may not be needed to practice every embodiment of the present invention.

Figure 3A:
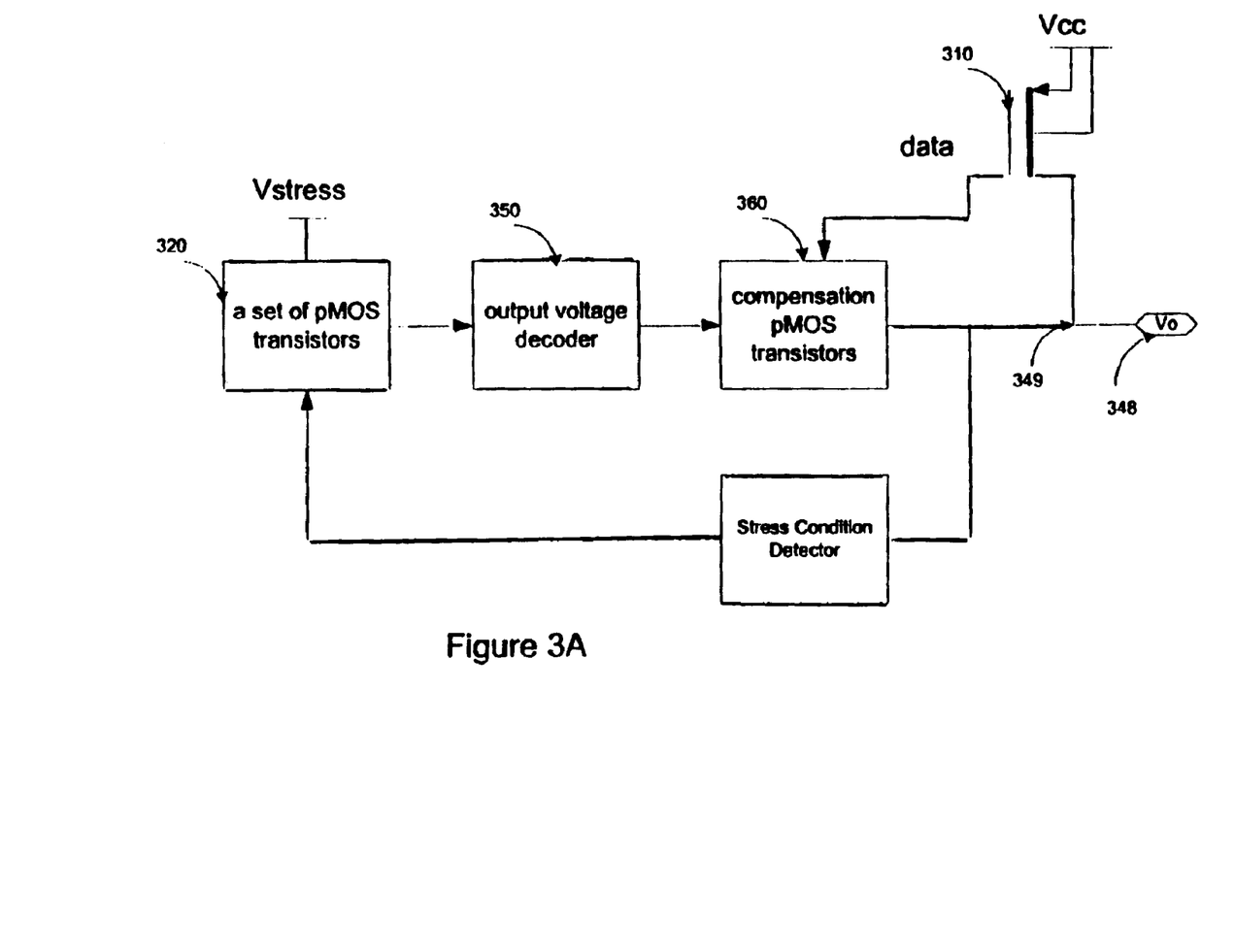
FIG. 3A shows an embodiment of the present invention.

FIG. 3A shows an embodiment of the present invention to compensate for drain current degradation of a primary pMOS transistor 310. The primary pMOS transistor 310 is connected to an input/output pad 348 at its drain. To mimic the drain current degradation of the primary pMOS transistor 310, the circuit in FIG. 3A includes a set of pMOS transistors 320 stressed by a stress voltage, Vstress, which causes drain current degradation in the set of pMOS transistors 320. The drain current degradation in the set of pMOS transistors 320 is monitored by an output voltage decoder 350. Based on the monitored result, the output voltage decoder 350 turns on or off one or a combination of compensation pMOS transistors 360 to compensate for the drain current degradation of the primary pMOS transistor 310. The compensation pMOS transistors 360 are coupled to both the primary pMOS transistor 310 and the input/output pad 348 at the node 349. The compensation drain current from the compensation pMOS transistors 360 flows into the node 349 to compensate for the drain current degradation of the primary pMOS transistor 310.

Figure 3B:
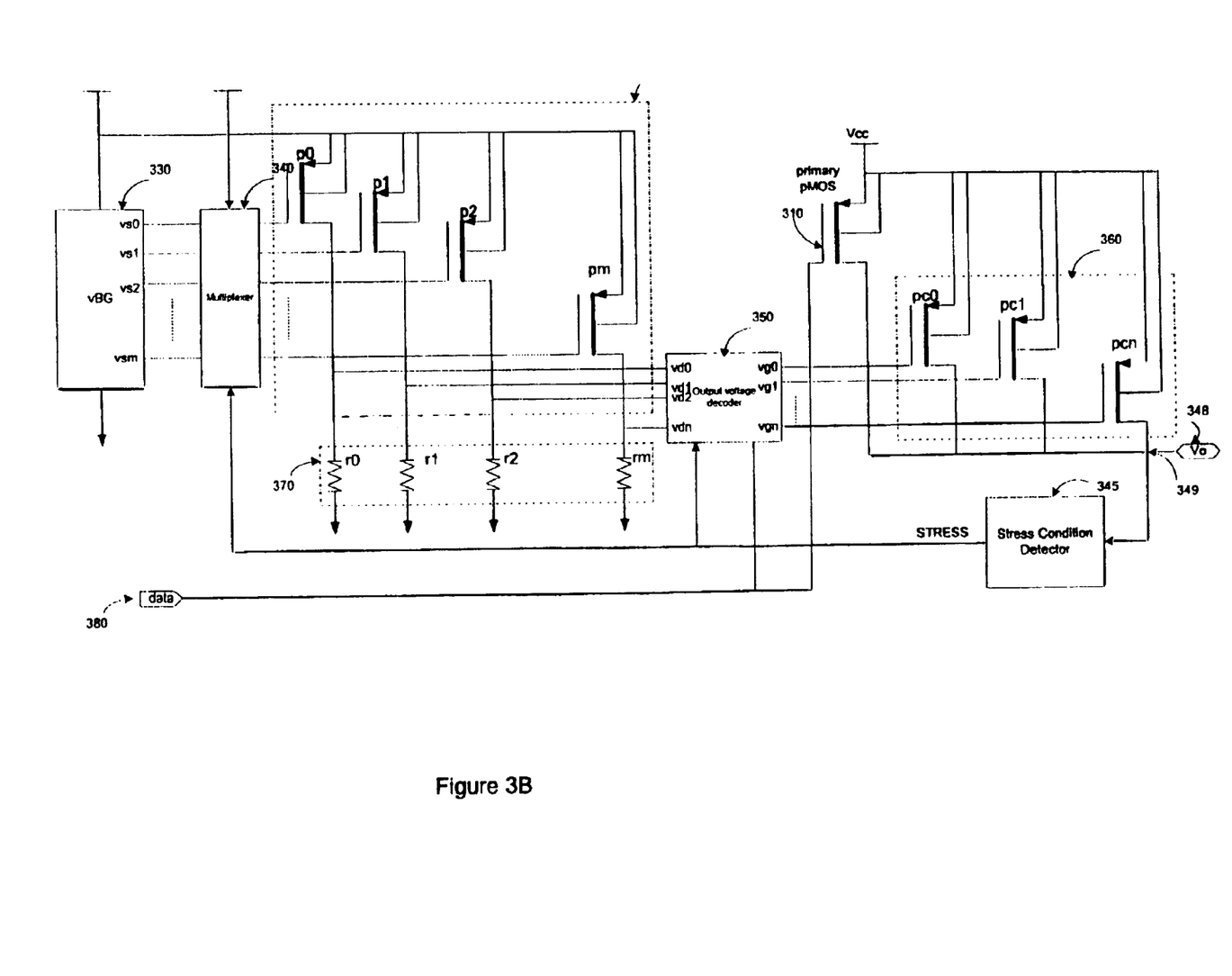
FIG. 3B shows an embodiment of the present invention.

The circuit arrangement shown in FIG. 3A is described with more details in FIG. 3B. The data 380 drives the primary pMOS transistor 310 at its gate, and the primary pMOS transistor 310 drives the input/output pad 348 at its drain. The resultant electric field causes drain current degradation in the primary pMOS transistor 310. To mimic the stress on the primary pMOS transistor 310, a stress voltage, Vstress, is applied to the gates of the pMOS transistors 320. Thus, the pMOS transistors 320 are subject to drain current degradation induced by the stress voltage, Vstress. The drain current degradation on the pMOS transistors 320 correlates to the drain current degradation in the primary pMOS transistor 310. In one embodiment, Vstress is greater than the source voltage of the pMOS transistors 320, Vcore, to create a potential difference on the pMOS transistors 320 in order to stress the gate oxide of the pMOS transistors 320. However, the specific value of Vcore is not critical. In one embodiment, Vcore is set to Vcc at 3V, which is the same as the source voltage of the primary pMOS transistor 310. In one embodiment, Vstress is set at 5V.

In one embodiment, the size of each of the pMOS transistors 320 is substantially similar to each other, and it is substantially similar to the primary pMOS transistor 310 as well. However, it should be apparent to a skilled person in the art that the pMOS transistors 320 can be different sizes as long as the drain current degradation of the pMOS transistors 320 correlates with the drain current degradation of the primary pMOS transistor 310. Similarly, the size of the pMOS transistors 320 can be different from the size of the primary pMOS transistor 310.

Besides the size of the pMOS transistors 320, different numbers of pMOS transistors 320 can be used in various embodiments of the present invention. The number of pMOS transistors 320 can be varied to achieve the desired range and granularity of drain current compensation. For example, in one embodiment, two pMOS transistors 320 are used. In another embodiment, 3 pMOS transistors 320 are used. The number of pMOS transistors 320 is related to the range and granularity of drain current compensation. The more pMOS transistors 320 are used, the wider the range or the finer the granularity of drain current compensation will result. In addition to varying the number of pMOS transistors 320 within a set, the number of sets of pMOS transistors 320 can be varied in different embodiments of the present invention. For example, in one embodiment where the input/output pad 348 is driven by multiple primary pMOS transistors 310, a set of pMOS transistors 320 is provided for each primary pMOS transistor driving the input/output pad 348. In another embodiment, a single set of pMOS transistors 320 is provided to only the most important primary pMOS transistor 310 even though there are multiple primary pMOS transistors driving the input/output. Drain current compensation may be provided to all primary pMOS transistors based on the monitored result of the most important primary pMOS transistor. In another embodiment, where there are more than one input/output in an interface, a single set of pMOS transistors 320 can be used to monitor only the most important primary pMOS transistor 310 in one of the input/output circuit. It should be apparent that these embodiments are described here to explain the present invention by way of examples, different numbers and combinations of pMOS transistors 320 can be used to practice the present invention without violating the spirit of it.

In one embodiment, the pMOS transistors 320 are biased from slightly to the conducting side of cut-off by (Vgs ~=|Vtp|) precision voltages to well into conduction (Vgs>|Vtp|). To facilitate monitoring of the drain current degradation of the aging pMOS transistors, a set of precision voltages (vs0:vsm), instead of Vstress, is applied to the gates of the pMOS transistors 320 to bias them during the measurement of the drain voltages of the pMOS transistors 320. The precision voltages spread across the range of (Vcore−Vtp) and (Vcore−1.5*Vtp) in one embodiment, where Vtp is the time-zero threshold voltage of the pMOS transistors 320. The values of the precision voltages are chosen to ensure the range of pMOS operation from resistive to near cut-off are exhibited by one or more of the pMOS transistors 320. The precision voltages are generated by a voltage bandgap reference source 330 ("vBG") in one embodiment of the present invention.

In addition to the pMOS transistors 320, one or more compensation pMOS transistors 360 are included in the circuit shown in FIG. 3B. The compensation pMOS transistors 360 shown have their sources and drains connected in parallel to the primary pMOS transistor 310. To compensate for the drain current degradation of the primary pMOS transistor 310, one or more of the compensation pMOS transistors 360 are activated. The number of compensation pMOS transistors 360 activated depends on the drain current degradation in the set of pMOS transistors 320, which correlates to the drain current degradation of the primary pMOS 310. The compensation drain current from the compensation pMOS transistors that are activated flows into the node 349 to compensate for the drain current degradation of the primary pMOS transistor 310. To regulate the incremental compensation of the drain current of the primary pMOS transistor 310, one can vary the number and/or the width of the compensation pMOS transistors 360. Furthermore, the configuration of compensation pMOS transistors 360 shown in FIG. 3B is merely an example of one embodiment of the present invention. Different numbers and/or configurations of compensation pMOS can be used to compensate drain current degradation of the primary pMOS transistor 310.

As explained above, the number of compensation pMOS transistors 360 turned on depends on the drain current degradation in the set of pMOS transistors 320. To monitor the drain current degradation in the pMOS transistors 320, the circuit in FIG. 3B includes an output voltage decoder 350. The output voltage decoder 350 monitors the drain current degradation of the set of pMOS transistors 320 by measuring the drain voltages of the pMOS transistors 320. As the pMOS transistors 320 degrade, their drain current drops, causing their drain voltages to drop as well. Based on the measured drain voltages of the pMOS transistors 320, the output voltage decoder 350 generates one or more output signals to activate the number of compensation pMOS transistors 360 needed to compensate for the drain current degradation of the primary pMOS. In the circuit shown in FIG. 3B, the output voltage decoder 350 applies its output voltages to the gates of the compensation pMOS transistors 360 to turn them on.

When a compensation pMOS transistor 360 is turned on, it generates compensation current flowing into the node 349. The combined current of the degraded drain current from primary pMOS transistor 310 and the compensation drain current would be of substantially similar magnitude as the initial drain current of the primary pMOS transistor 310. Therefore, the drain current of the primary pMOS transistor appears to remain substantially constant over time. In sum, the output voltage decoder activates the compensation pMOS transistors 360 to compensate for the drain current degradation of the primary pMOS 310 based on the monitored result of the drain current degradation of the pMOS transistors 320.

The drain current degradation of the pMOS transistors 320 is induced by Vstress on the gates of the pMOS transistors 320. To control the application of Vstress onto the gates of the pMOS transistors 320, the circuit in FIG. 3B includes a stress condition detector 345. A stress condition detector 345 may sense the voltage at the input/output pad 348. In this example, when the voltage at the input/output pad 348 exceeds a predetermined limit, the stress condition detector 345 sets an output signal STRESS to a logical high. On the other hand, when the voltage at the input/output pad 348 drops below the predetermined limit, the stress condition detector 345 sets STRESS back to low. When STRESS is high, Vstress is applied to the set of pMOS transistors 320 to mimic the magnitude and duration of the stress on the primary pMOS 310. When STRESS is low, the set of precision voltages are applied to the set of pMOS transistor 320 to allow the output voltage decoder 350 to measure the drain voltages of each of the pMOS transistors 320.

In one embodiment, a multiplexer 340 is included to facilitate the control of the gate voltages of the pMOS transistors 320 by STRESS. The multiplexer 340 receives the signal STRESS, the precision voltages and Vstress. When STRESS is high, the multiplexer 340 applies Vstress to the gates of the pMOS transistors 320 to induce drain current degradation. When STRESS is low, the multiplexer 340 applies the precision voltages to the gates of the pMOS transistors 320 to enable the output voltage decoder 350 to measure the drain voltages of the pMOS transistors 320.

To facilitate the measurement of the drain voltages of the pMOS transistors 320, the circuit in FIG. 3B includes a set of resistive loads 370. Each one of the resistive loads 370 is coupled between the drain of each of the pMOS transistors 320 and the ground. Therefore, the voltage across each of the resistive loads 370 is substantially similar to the drain voltage of the pMOS transistor 320 coupled to that particular resistive load 370. When the multiplexer 340 applies the precision voltages to the gates of the pMOS transistors 320, the output voltage decoder 350 measures the drain voltages of the pMOS transistors 320 by measuring the voltages across the corresponding resistive loads 370.

In one embodiment, the values of the resistive loads 370 are substantially similar to each other. However, it is apparent to one of ordinary skill in the art that resistive loads of different values can be used. Furthermore, the resistive loads can be implemented in various ways. For example, one embodiment can implement the resistive loads with resistors, while another embodiment can implement the resistive loads with combinations of nMOS transistors well known in the art. The description here is by way of example only, and should not be construed limitations.

By stressing the set of pMOS transistors 320 and monitoring their drain current degradation, which correlates to the drain current degradation of the primary pMOS transistor 310, the current degradation of the primary pMOS transistor 310 is continuously monitored. The continuous monitoring of the primary pMOS transistor 310 allows active compensation for the drain current of the primary pMOS transistor 310 during operation of the input/output. Furthermore, this embodiment of the present invention does not require any external components or clock signals from the system; thus, the drain current compensation provided is asynchronous, continuous, and transparent.

Figure 4:
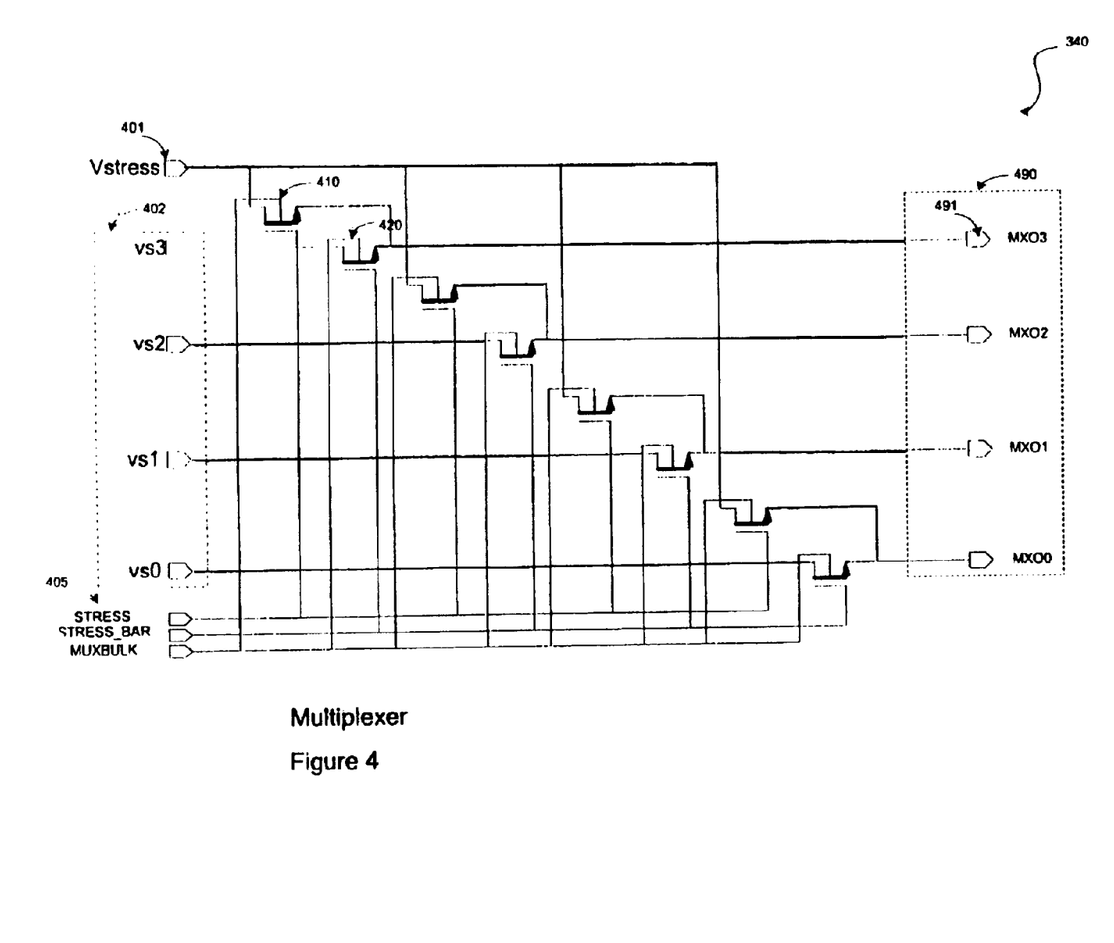
FIG. 4 shows an embodiment of a multiplexer.

A detailed description of an embodiment of the multiplexer 340 is shown in FIG. 4. In FIG. 4, the multiplexer 340 outputs either the stress voltage (Vstress-$V_{tN}$), or one of the precision voltages 490 (MXO0:MXO3). The multiplexer applies the output voltages 490 to the gates of a set of pMOS transistors 320 (see FIG. 3B) to enable degradation monitoring or to cause drain current degradation in them, which correlates with the drain current degradation of the primary pMOS transistor 310. A pair of nMOS pass transistors 410 and 420 controls the output voltage at MXO3 491. As discussed above, the signal STRESS 405 selects either (Vstress-$V_{tN}$) or the precision voltages 402 minus $V_{tN}$ (e.g. Vmxo3=(Vstress-$V_{tN}$) or (vs3-$V_{tN}$)) to apply to the pMOS transistors 320 in FIG. 3B. When STRESS 405 is high, the nMOS transistor 420 is turned off and nMOS transistor 410 is turned on to put Vstress 401-$V_{tN}$ on the output pad of MXO3 491. When STRESS is low, nMOS transistor 410 is turned off and nMOS transistor 420 is turned on to put the corresponding precision voltage minus $V_{tN}$, that is vs3-$V_{tN}$, onto the output pad of MXO3 491. The other output voltages, namely MXO2, MXO1, and MXO0 are controlled in a similar fashion by the rest of the nMOS pass transistors in FIG. 4.

Figure 5:
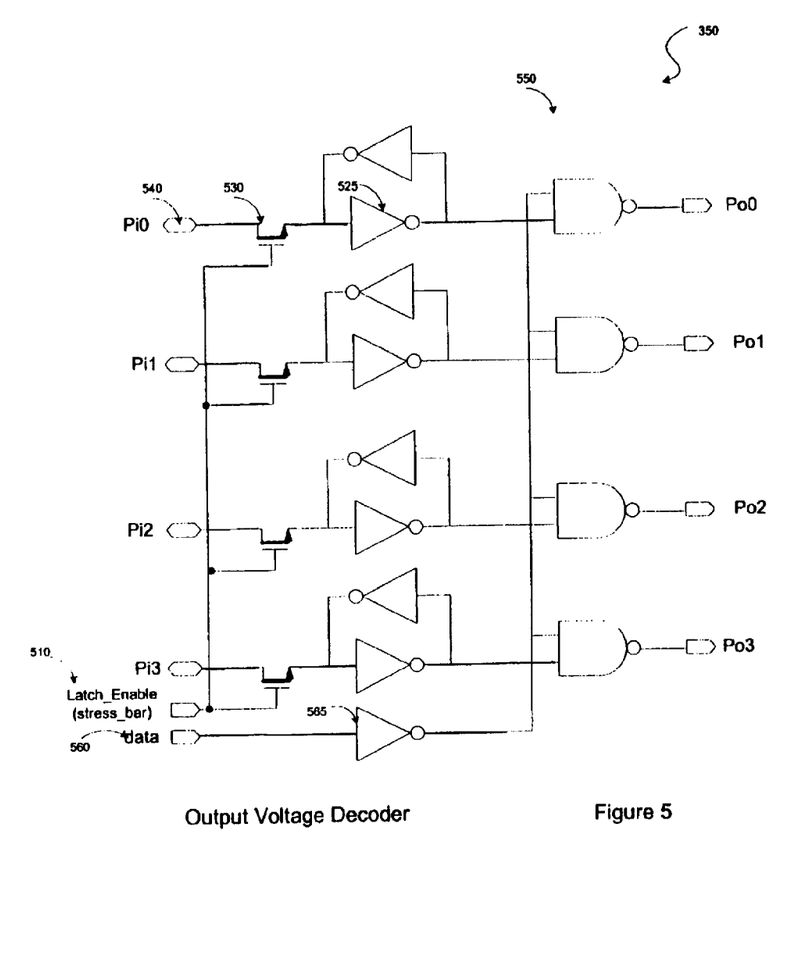
FIG. 5 shows an embodiment of an output voltage detector.

In FIG. 5, a detailed description of the output voltage decoder 350 used in one embodiment of the present invention is shown. The output voltage decoder monitors the drain voltages of the pMOS transistors 320 in FIG. 3B. The signal Latch_Enable 510 in FIG. 5 corresponds to the opposite of the signal STRESS in FIG. 3B. STRESS is high when the pMOS transistors 320 are stressed. Thus, Latch_Enable 510 is low when the pMOS transistors 320 are stressed, and Latch_Enable 510 goes high when the pMOS transistors 320 are not stressed. When Latch_Enable 510 goes high, the output voltage decoder 350 latches the logic state set by the drain voltages of the pMOS transistors 320. The output voltage decoder in FIG. 5 implements the latch by connecting each input (Pi0:Pi3) pad through an nMOS pass transistor to a pair of cross-coupled inverters. To explain the operation of the circuit in FIG. 5, we shall focus on the input voltage Pi0.

The input voltage Pi0 is applied to the input node 540. An nMOS switch 530 is coupled between the input node 540 and the inverter 525. When Latch_Enable 510 goes high, the nMOS switch 530 is turned on to pass the voltage at the input pad 540 minus $V_{tN}$ to the inverter 525. Recall that the voltage at the input pad 540 is the drain voltage of one of the pMOS transistors 320 in FIG. 3B less $V_{tN}$. When the drain current of one of the pMOS transistors 320 in FIG. 3B degrades, the drain voltage of it drops accordingly, thus, the input voltage Pi0 at the input voltage pad 540 drops as well. When the drain current of the pMOS transistor 320 degrades to a level such that the voltage at the input of the inverter 525 drops below its switch point, the output of the inverter 525 goes from a logical low to a logical high.

The output of the inverter 525 goes into an NAND gate 550 coupled to the inverter 525. Thus, when the output of the inverter 525 is high, the output of the NAND gate 550 is the opposite of the other input signal of the NAND gate 550. Data 560 is inverted through the inverter 565 to data_bar, which is input to the NAND gate 550. Thus, when the output of the inverter 525 is high, the NAND gate 550 outputs data 560. The output of the NAND gate 550 is the output signal Po0 of the output voltage decoder, which drives the gate of one of the compensation pMOS transistors 360 in FIG. 3B. Therefore, the output voltage decoder 350 puts data 560 onto a compensation pMOS transistor 360 coupled to Po0 when the drain current of the pMOS transistor 320 monitored drops below a certain level. Putting data 560 onto the gate of the compensation pMOS transistor 360 would turn it on or off with the primary pMOS transistor, which is also driven by data When the output of inverter 525 is low, its corresponding (Po0:Po3) output is driven high which disables the compensation pMOS 360.

Another embodiment of the output voltage decoder 350 comprises an analog-to digital converter. An analog-to digital converter converts the analog signals corresponding to the drain voltages of the pMOS transistors 320 in FIG. 3B to digital signals. The digital signals are applied to the compensation pMOS transistors 360 to activate as many compensation pMOS transistors 360 as needed to compensate the drain current degradation of the primary pMOS transistor 310. The description of these embodiments of the output voltage decoder here is by way of example only, and should not be construed as limitations in any way.

Figure 6:
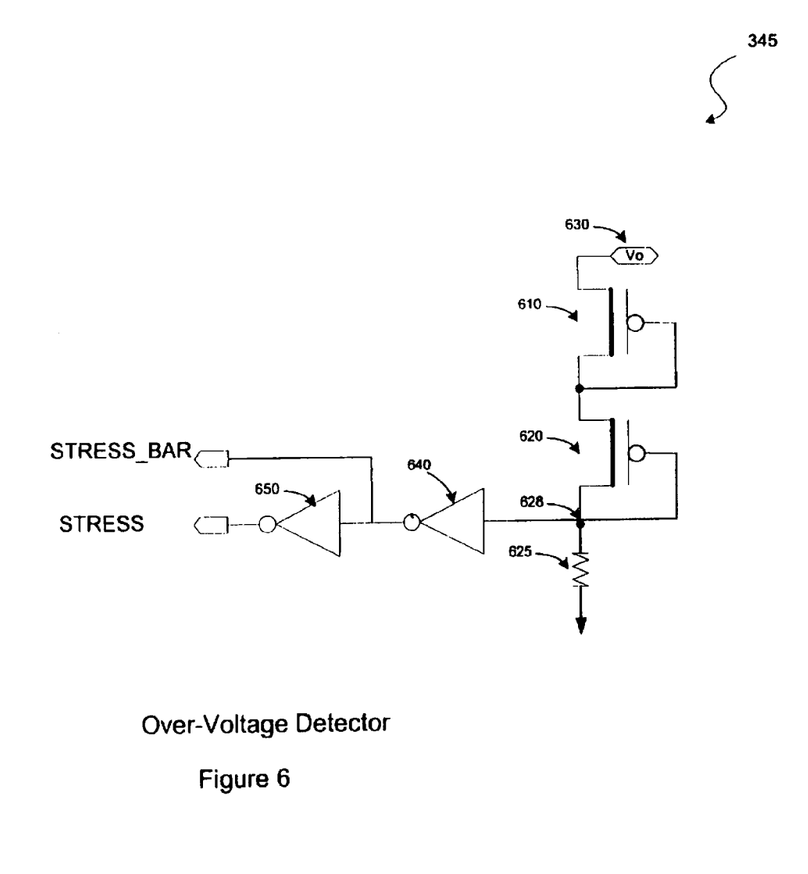
FIG. 6 shows an embodiment of a stress condition detector.

One embodiment of the present invention includes a stress condition detector 345. FIG. 6 shows an exemplary illustration of the stress condition detector 345. The input/output pad 630 corresponds to the input/output pad 348 in FIG. 3B. The voltage at the input/output pad 630 is Vo. Two diode-connected pMOS transistors 610 and 620 are coupled in series to the input/output pad 630. The pMOS transistor 620 is further coupled to a pull-down resistor 625. The value of Vo at which STRESS goes high is approximately twice the absolute value of the threshold voltage of the primary pMOS transistor 310 in FIG. 3B. When Vo rises above this value, the voltage at node 628 rises with Vo to invert the logic states of STRESS and STRESS_BAR through the inverters 640 and 650. The STRESS and STRESS_BAR signals control the stressing of the pMOS transistors 320 as well as the latching of their drain voltages as discussed above. To set the Vo at which STRESS goes high, one can change the number of diode-connected pMOS transistors in the stress condition detector 345. The circuit in FIG. 6 is provided for illustration only. Other implementations of stress condition detectors can be used and other voltages can be monitored in other embodiments of the present invention.

Figure 7:
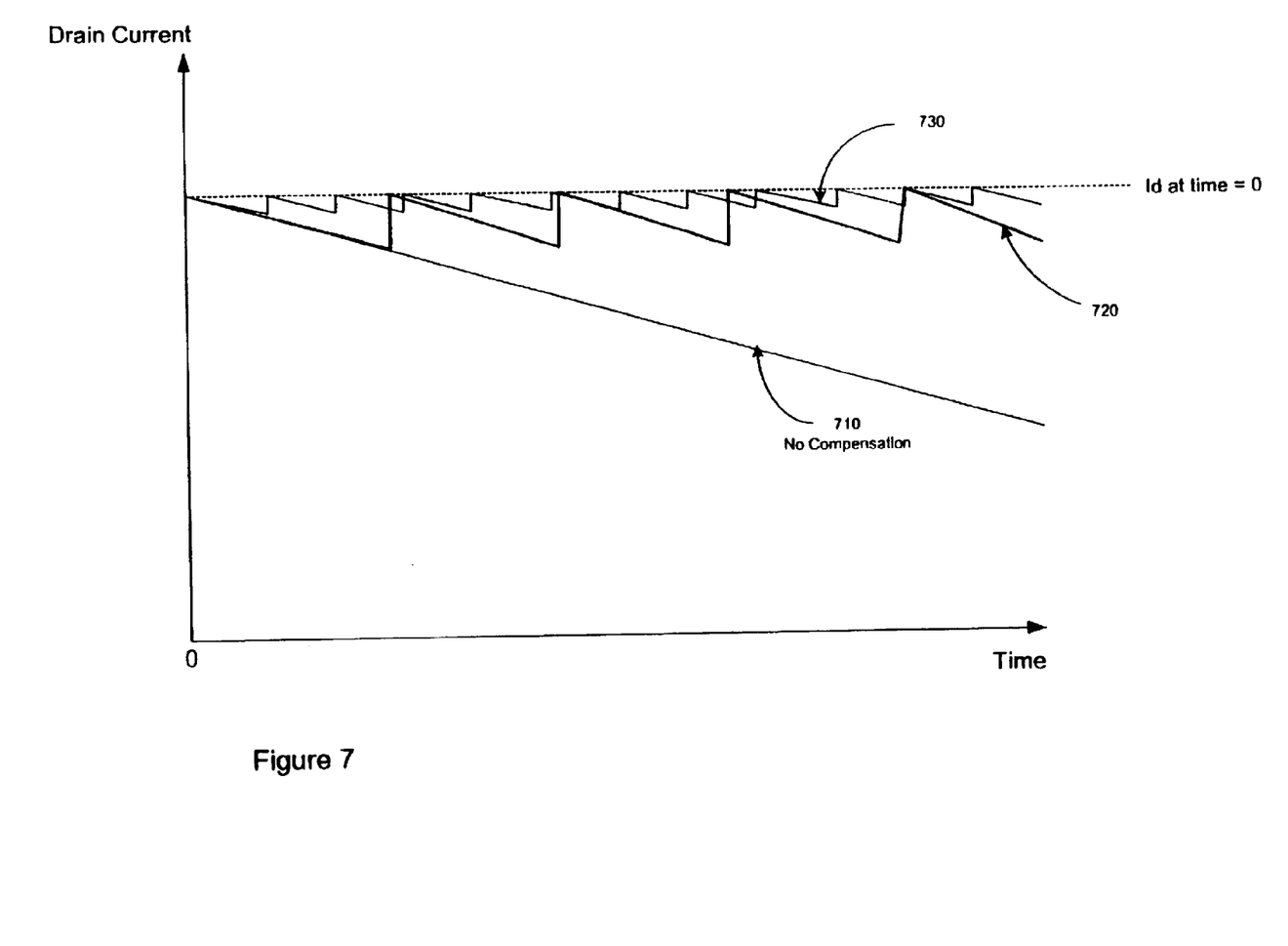
FIG. 7 shows the drain current of a pMOS transistor without compensation and the drain current of a pMOS transistor with compensation.

FIG. 7 shows the drain current of a primary pMOS transistor with compensation and the drain current of the primary pMOS transistor without compensation. Curve 710 in FIG. 7 shows the drain current of the primary pMOS transistor without compensation, which gradually decreases over time and with temperature. The other curve 720 shows the drain current of the primary pMOS transistor with compensation. As shown by the curve 720, the level of drain current remains substantially constant with compensation because as the drain current degrades to a certain level, the compensation mechanism kicks in to activate as many compensation pMOS transistors as required, which generate compensation drain current to bring the level of the total drain current back up to substantially the initial level of drain current. As drain current degradation goes on, the compensation mechanism repeats itself until all compensation pMOS transistors are turned on. Thus, the compensation scheme keeps the total drain current substantially constant over time. Depending on the range and granularity of compensation desired, the number of pMOS transistors 320, the number of resistive loads 370, and the number of compensation pMOS transistors 360 can be varied accordingly in the circuit shown in FIG. 3B. Increasing the number of pMOS 320 would produce a degradation curve like 730 in FIG. 7.

The circuit described herein compensates for drain current degradation in pMOS transistors without using any external components. Therefore, embodiments of the present invention have the advantage of reduced signal paths and firmware specific to the external component calibration and compensation. Furthermore, existing or legacy input/output cannot accommodate additional external components or signals. Thus, embodiments of the present invention can compensate for drain current degradation of pMOS transistors driving a high voltage legacy input/output while the approach using external components and signals cannot.

Figure 8:
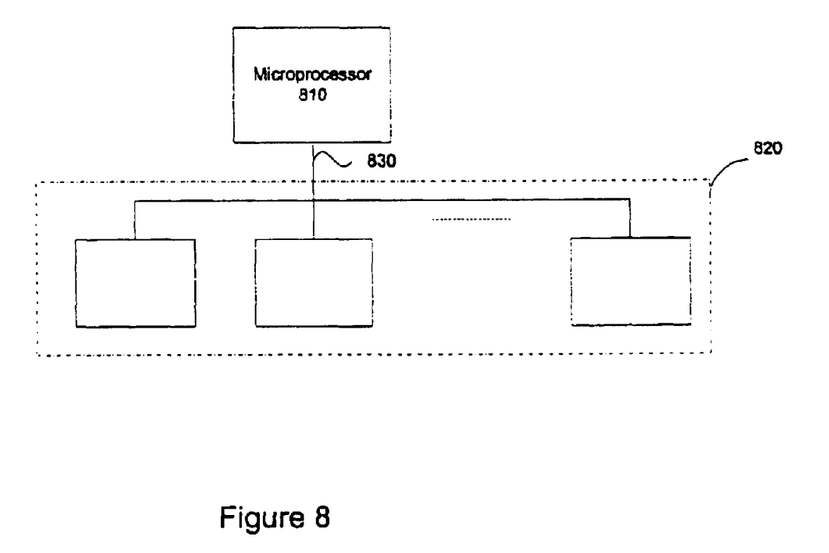
FIG. 8 shows a computer system.

One embodiment of the present invention is shown in FIG. 8. The system includes a microprocessor 810 and a set of devices 820 coupled to the microprocessor by a bus 830. Examples of the devices include, but not limited to, memory control hub, interface control hub, graphics controller, etc. The devices 820 further include one or more input/output pads. A primary pMOS transistor drives at least one of the input/output pads. The system further includes at least one set of pMOS transistors, which are subject to drain current degradation correlated to the drain current degradation of the primary pMOS transistor. The system further includes at least one compensation pMOS transistor and an output voltage decoder. The output voltage decoder controls the compensation pMOS transistors. The output voltage decoder turns on or off an appropriate combination of the compensation pMOS transistors to compensate for the drain current degradation of the primary pMOS transistors based on monitored drain current degradation of the set of pMOS transistors. In one embodiment, an stress condition detector is included to detect the voltage at the drain of the primary pMOS transistor. In one embodiment, a multiplexer is included to apply either a stress voltage or a set of precision voltages to the set of pMOS transistors.

The forgoing discussion merely describes some exemplary embodiments of the present invention. One skilled in the art will readily recognize from such discussion, the accompanying drawings and the claims that various modifications can be made without departing from the spirit and scope of the embodiments of the present invention.

I claim:

1. An apparatus to compensate for drain current degradation of a primary pMOS transistor, comprising:
   a plurality of pMOS transistors subject to drain current degradation correlating to drain current degradation of the primary pMOS transistor;
   at least one compensation pMOS transistors coupled in parallel with the primary pMOS transistor; and
   an output voltage decoder to activate one or more of the compensation pMOS transistors to compensate for the drain current degradation of the primary pMOS transistor based on monitored drain current degradation of the plurality of pMOS transistors.

2. The apparatus according to claim 1, further comprises:
   a stress condition detector to monitor the primary pMOS transistor's drain voltage to determine when a stress voltage should be applied to the plurality of pMOS transistors.

3. The apparatus according to claim 2, further comprises:
   a multiplexer responsive to the stress condition detector to apply either the stress voltage or a plurality of precision voltages to the plurality of pMOS transistors.

4. The apparatus according to claim 3, further comprises:
   a plurality of resistive loads, each coupled between one of the plurality of pMOS transistors' drain and ground, where the output voltage decoder monitors the drain current degradation of the plurality of pMOS transistors by measuring the plurality of voltages across the plurality of resistive loads.

5. The apparatus according to claim 4, where each of the plurality of resistive loads is substantially similar to each other and each of the plurality of pMOS transistors is substantially similar to each other.

6. The apparatus according to claim 1, where the output voltage decoder comprises an analog-to-digital converter.

7. The apparatus according to claim 3, further comprises:
a voltage bandgap reference source to generate the plurality of precision voltages.

8. The apparatus according to claim 1, where each of the plurality of pMOS transistors is substantially similar to the primary pMOS transistor.

9. A method to compensate drain current degradation of a primary pMOS transistor, comprising:
subjecting a plurality of pMOS transistors to drain current degradation correlated to the drain current degradation of the primary pMOS transistor;
monitoring the drain current degradation of the plurality of pMOS transistors; and
activating one or more compensation pMOS transistors coupled in parallel with the primary pMOS transistor to compensate for the drain current degradation of the primary pMOS transistor based on the monitored drain current degradation of the plurality of pMOS transistors.

10. The method of claim 9, further comprises:
monitoring the primary pMOS transistor's drain voltage to determine when a stress voltage should be applied to the plurality of pMOS transistors to subject the plurality of pMOS transistors to drain current degradation.

11. The method of claim 10, further comprises:
applying a plurality of precision voltages to the plurality of pMOS transistors when the stress voltage is not applied to the plurality of pMOS transistors.

12. The method of claim 11, further comprises:
coupling a plurality of resistive loads, each between the drain of one of the plurality of pMOS transistors and ground; and
measuring the voltages across the resistive loads to, monitor the drain current degradation of the first plurality of pMOS transistors.

13. The method of claim 12, where each of the plurality of resistive loads is substantially similar to each other and each of the first plurality of pMOS transistors is substantially similar to each other.

14. The method of claim 9, where each of the plurality of pMOS transistors is substantially similar to the primary pMOS transistor.

15. The method of claim 11, further comprises:
generating the plurality of precision voltages.

16. A circuit, comprising:
one or more input/output pads;
one or more primary pMOS transistors driving at least one of the input/output pads;
a plurality of pMOS transistors subject to drain current degradation correlating to drain current degradation of the primary pMOS transistor;
at least one compensation pMOS transistors coupled in parallel with the primary pMOS transistor; and
an output voltage decoder to monitor the drain current degradation of the plurality of pMOS transistors, and to activate one or more of the compensation pMOS transistors to compensate for the drain current degradation of the primary pMOS transistor.

17. The circuit according to claim 16, further comprises:
a stress condition detector to monitor the primary pMOS transistor's drain voltage to determine when a stress voltage should be applied to the plurality of pMOS transistors.

18. The circuit according to claim 17, further comprises:
a multiplexer responsive to the stress condition detector to apply either the stress voltage or a plurality of precision voltages to the plurality of pMOS transistors.

19. A system, comprising:
a microprocessor;
one or more buses; and
one or more devices coupled to the microprocessor by the buses, where the devices further comprises:
one or more input/output pads;
one or more primary pMOS transistor driving at least one of the input/output pads;
a plurality of pMOS transistors subject to drain current degradation correlating to drain current degradation of the primary pMOS transistor;
one or more compensation pMOS transistors coupled in parallel with the primary pMOS transistor; and
an output voltage decoder to activate one or more of the compensation pMOS transistors to compensate for the drain current degradation of the primary pMOS transistor based on monitored drain current degradation of the plurality of pMOS transistors.

20. The system according to claim 19, further comprises:
a stress condition detector to monitor the primary pMOS transistor's drain voltage to determine when a stress voltage should be applied to the plurality of pMOS transistors.

21. The system according to claim 20, further comprises:
a multiplexer responsive to the stress condition detector to apply either the stress voltage or a plurality of precision voltages to the plurality of pMOS transistors.

* * * * *

UNITED STATES PATENT AND TRADEMARK OFFICE
CERTIFICATE OF CORRECTION

PATENT NO. : 6,768,351 B1
DATED : July 27, 2004
INVENTOR(S) : Davis

It is certified that error appears in the above-identified patent and that said Letters Patent is hereby corrected as shown below:

Column 8,
Line 26, delete "forgoing" and insert -- foregoing --.

Column 9,
Line 35, delete "to, monitor" and insert -- to monitor --.

Signed and Sealed this

Seventh Day of December, 2004

JON W. DUDAS
*Director of the United States Patent and Trademark Office*